United States Patent [19]

Hipps, Sr. et al.

[11] Patent Number: 5,176,984
[45] Date of Patent: Jan. 5, 1993

[54] PHOTOHARDENABLE COMPOSITIONS CONTAINING A BORATE SALT

[75] Inventors: Jesse Hipps, Sr.; Michael S. Shanklin, both of Dayton; Paul Davis, Centerville, all of Ohio

[73] Assignee: The Mead Corporation, Dayton, Ohio

[21] Appl. No.: 685,991

[22] Filed: Apr. 12, 1991

Related U.S. Application Data

[63] Continuation of Ser. No. 426,819, Oct. 25, 1989, abandoned.

[51] Int. Cl.⁵ ............................................. G03F 7/029
[52] U.S. Cl. ................................... 430/281; 430/914; 430/915; 522/25
[58] Field of Search ................. 430/281, 914, 915; 522/25

[56] References Cited

U.S. PATENT DOCUMENTS

| | | | |
|---|---|---|---|
| 3,567,453 | 3/1971 | Borden | 430/339 |
| 4,343,891 | 8/1982 | Assen et al. | 430/339 |
| 4,772,530 | 9/1988 | Gottschalk et al. | 430/281 |
| 4,772,541 | 9/1989 | Gottschalk et al. | 430/339 |
| 4,859,572 | 8/1989 | Farial et al. | 430/914 |
| 4,937,161 | 6/1990 | Kita et al. | 430/914 |
| 4,954,414 | 9/1990 | Adair et al. | 430/281 |
| 4,971,891 | 11/1990 | Kawamura et al. | 430/281 |
| 5,011,760 | 4/1991 | Yamaguchi | 430/914 |

FOREIGN PATENT DOCUMENTS 37-168192 3/1962 Japan.

Primary Examiner—Marion E. McCamish
Assistant Examiner—Christopher D. Rodee
Attorney, Agent, or Firm—Thompson, Hine and Flory

[57] ABSTRACT

A photohardenable composition comprising a free radical addition polymerizable or crosslinkable compound, a cationic dye-borate anion complex, and a borate salt, said complex being capable of absorbing actinic radiation and producing free radicals which initiate free radical polymerization or crosslinking of said compound.

13 Claims, No Drawings

PHOTOHARDENABLE COMPOSITIONS CONTAINING A BORATE SALT

This is a continuation of co-pending application Ser. No. 07/426,819, filed Oct. 25, 1989 now abandoned.

BACKGROUND

The present invention relates to an improved photohardenable composition of the type described in U.S. Pat. No. 4,772,541 containing a photohardenable compound, a complex of a cationic dye and a borate as a photoinitiator, and a borate salt.

U.S. Pat. No. 4,772,541 is incorporated herein by reference. This patent discloses photohardenable compositions which contain a dye complex of the formula (I):

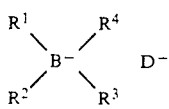

where $D^+$ is a cationic dye; and $R^1$, $R^2$, $R^3$, and $R^4$ are independently selected from the group consisting of alkyl, aryl, alkaryl, allyl, aralkyl, alkenyl, alkynyl, alicyclic and saturated or unsaturated heterocyclic groups. As noted in the patent, these groups may be substituted or unsubstituted.

Useful dyes form photoreducible but dark stable complexes with borate anions and can be cationic methine, polymethine, triarylmethane, indoline, thiazine, xanthene, oxazine and acridine dyes. More specifically, the dyes may be cationic cyanine, carbocyanine, hemicyanine, rhodamine and azomethine dyes.

Preferred dyes are cyanine dyes of the formula (II)

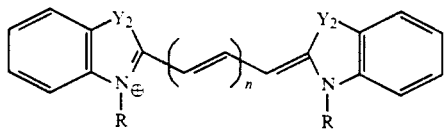

where n is 0, 1, 2 or 3; R is an alkyl group and preferably an alkyl group having 4 to 10 carbon atoms; and y is $-CH=CH-$, $>NCH_3$, $>C(CH_3)_2$, O, S, or Se The borate anion is designed such that the borate radical generated upon exposure to light and after electron transfer to the dye (Eq. 1) readily dissociates with the formation of a radical as follows:

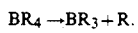  (Eq. 1)

For example particularly preferred anions are triphenylbutylborate, trianisylbutylborate, and triphenylsecbutyl borate anions because they readily dissociate to triphenylborane or trianisylborane and a butyl radical. As explained in U.S. Pat. No. 4,772,541, the Weller equation is useful in identifying useful complexes.

To enhance the film speed of photohardenable compositions described in the aforementioned patent, compounds such as N,N-dialkylanilines and more particularly diisopropyldimethylaniline may be added to the composition. Thiols such as mercaptobenzothiazole may also be added to the composition.

SUMMARY OF THE INVENTION

In accordance with this invention, an improvement in the aforementioned compositions is provided through the addition of a borate salt. The term "borate salt" as used herein does not mean a dye-borate complex. Rather it means a salt in which the cation is not a dye molecule. It is believed that the addition of the borate salt reduces any tendency of the complex to dissociate when it is dissolved in the monomer. As a result, the dye and the borate anion remain tightly paired, such that election transfer is very efficient. This improves short time scale reciprocity failure. There is evidence that the salt also improves the toe speed of the composition.

DETAILED DESCRIPTION OF THE INVENTION

Useful borate salts can be represented by the formula (III):

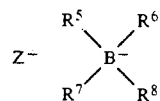

where $Z^+$ is a cation which does not absorb in the region in which the dye-borate complex absorbs and which is sufficiently oleophilic to make the salt soluble in the photohardenable composition in effective concentrations. Examples of useful cations are cations such as trimethylcetylammonium, benzethonium, cetylpyridinium (CPTB), etc., $R^5$-$R^8$ may be selected from the group consisting of an alkyl group, an aryl group, an alkaryl group, an allyl group, an aralkyl group, an alkenyl group, an alkynyl group, an alicyclic group, and a saturated or unsaturated heterocyclic group which may be substituted or unsubstituted.

Preferably $R^5$-$R^8$ are the same as $R^1$-$R^4$ in the dye complex present in the composition. This is not essential, however, because there will be ionic exchange between the borate salt and the dye complex. However, it is essential that the borate anion of the salt have the ability to dissociate and form a free radical in accordance with Eq. 1 above. If the borate anion of the salt cannot form radicals as effectively as the borate ion associated with the dye, addition of the salt may diminish rather than improve the function of the photoinitiator. Preferred $R^5$-$R^8$ are triphenyl(n-butyl) and triphenyl(sec-butyl) as in the case of $R^1$-$R^4$. Triphenylbenzyl, triphenylallyl, and triphenylcyclopropyl may also be useful borates.

Specific examples of cationic dye-borate anion complexes useful in the present invention are shown below with their λ max.

[Structure: bis-benzazole cyanine dye with C7H15 N-substituents, polymethine chain of length n, with counterion BR'₃R"⁻]

| | n | Y₁ | Y₂ | R' | R" | Max |
|---|---|---|---|---|---|---|
| Compound 1 | 1 | >C(CH₃)₂ | >C(CH₃)₂ | C₆H₅ | Sec-C₄H₉ | 550 |
| Compound 2 | 2 | >C(CH₃)₂ | >C(CH₃)₂ | C₆H₅ | Sec-C₄H₉ | 650 |
| Compound 3 | 0 | S | >C(CH₃)₂ | C₆H₅ | Sec-C₄H₇ | 436 |
| Compound 4 | 1 | >C(CH₃)₂ | >C(CH₃)₂ | C₆H₅ | neopentyl | 550 |
| Compound 5 | 2 | >C(CH₃)₂ | >C(CH₃)₂ | C₆H₅ | neopentyl | 650 |
| Compound A (comparison) | 1 | >C(CH₃)₂ | >C(CH₃)₂ | C₆H₅ | n-C₄H₉ | 550 |
| Compound B (comparison) | 2 | >C(CH₃)₂ | >C(CH₃)₂ | C₆H₅ | n-C₄H₉ | 650 |
| Compound C | 0 | S | >C(CH₃)₂ | C₆H₅ | n-C₄H₉ | |

The most typical example of a free radical addition polymerizable or crosslinkable compound useful in the present invention is an ethylenically unsaturated compound and, more specifically, a polyethylenically unsaturated compound. These compounds include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol, and the like; and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxpentacrylate (DPHPA), hexanediol-1,6-dimethacrylate, and diethyleneglycol dimethacrylate. A combination of TMPTA and DPHPA is often preferred.

While the cationic dye-borate anion complex can be used alone as the initiator, film speeds tend to be quite low and oxygen inhibition is observed. It has been found that it is preferable to use the complex in combination with an autoxidizer. An autoxidizer is a compound which is capable of consuming oxygen in a free radical chain process.

Representative examples of N,N-dialkylanilines useful in the present invention are 4-cyano-N, N-dimethylaniline, 4-acetyl-N,N-dimethylaniline, 4-bromo-N,N-dimethylaniline, ethyl 4-(N,N-dimethylamino) benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylthioanicidine, 4-amino-N,N-dimethylaniline, 3-hydroxy-N,N-dimethylaniline, N,N,N',N'-tetramethyl-1,4-dianiline, 4-acetamido-N,N-dimethylaniline, etc. Preferred N,N-dialkylanilines are 2,6-diisopropyl-N,N-dimethylaniline (DIDMA), 2,6-diethyl-N,N-dimethylaniline, N,N,2,4,6-pentamethylaniline (PMA) and p-t-butyl-N,N-dimethylaniline.

Thiols and disulfides also appear to enhance film speed although the mechanism is not clear. Particularly preferred thiols are selected from the group consisting of mercaptobenzoxazoles, mercaptotetrazines, mercaptotriazines and mercaptobenzothiazoles. Representative examples include 2-mercaptobenzothiazole, 6-ethoxy-2-mercaptobenzothiazole, 2-mercaptobenzoxazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4 methoxybenzenethiol, 1-phenyl-1H-tetrazole-5-thiol, 4 phenyl-4H 1,2,4-triazole-3-thiol, 2-mercaptobenzimidazole, pentaerythritol tetrakis (mercaptoacetate), pentaerythritol tetrakis (3-mercaptoproprionate), trimethylolpropane tris(mercaptoacetate), 4-acetamidothiophenol, mercaptosuccinic acid, dodecanethiol, 2-mercaptopyridine, 4-mercaptopyridine, 2-mercapto-3H-quinazoline, and 2-mercaptothiazoline. Disulfides as described in U.S. application Ser. No. 321,257 are also useful.

The cationic dye-borate anion complex is usually used in an amount up to about 1% by weight based on the weight of the photopolymerizable or crosslinkable species in the photohardenable composition. More typically, the cationic dye-borate anion complex is used in an amount of about 0.2% to 0.5% by weight. The autoxidizers are preferably used in the present invention in concentrations of about 4-5% by weight, and the borate salt is used in an amount of at least 0.2% and most typically 0.2 to 3%.

The invention is illustrated in more detail by the following example.

EXAMPLE 1

The following internal phase compositions were prepared and microencapsulated in melamine-formaldehyde microcapsules using the procedure described in U.S. Pat. No. 4,772,541.

|  | Composition A (control) | Composition B (control) |
|---|---|---|
| TMPTA | 100 parts | 100 parts |
| thereof | — | 0.29 |
| Compound 4 | 0.33 | 0.33 |
| DIDMA | 6.0 | 6.0 |
| Color Precursor | 24.0 | 24.0 |
| N-100 (Mobay) | 6.6 | 6.6 |

The microencapsulated compositions were coated on aluminized PET, dried, exposed through a step-wedge, assembled with a developer image and an image of the stepwedge was developed by passing the assembly through the nip between a pair of pressure rollers. A comparison of density versus step number showed there was approximately a four step improvement in the toe speed of the composition containing the borate salt.

Having described the invention in detail and by reference to preferred embodiments thereof, it will be apparent that modifications and variations are possible without departing from the scope of the invention defined in the appended claims.

What is claimed is:

1. A photohardenable composition comprising a free radical addition polymerizable or crosslinkable compound; a cationic dye-borate anion complex of the formula:

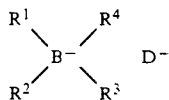

where D+ is a cationic dye moiety; and $R^1$, $R^2$, $R^3$ and $R^4$ are the same or different and are selected from the group consisting of alkyl, aryl, aralkyl, alkaryl, alkenyl, alkynyl, alicyclic, heterocyclic, and allylic groups, said complex being capable of absorbing actinic radiation and producing free radicals which initiate free radical polymerization or crosslinking of said compound; and a borate salt of the formula:

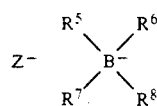

where Z+ is a cation which does not absorb in the region in which the dye-borate complex absorbs and which is sufficiently oleophilic to make said salt soluble in said photopolymerizable composition; and $R^5$, $R^6$, $R^7$ and $R^8$ are independently selected from the group consisting of an alkyl group, an aryl group, an alkaryl group, an allyl group, an aralkyl group, an alkenyl group, an alkynyl group, an alicyclic group, and a saturated or unsaturated heterocyclic group which may be substituted or unsubstituted.

2. The photohardenable composition of claim 1 wherein said cationic dye is selected from the group consisting of cationic methine, polymethine, triarylmethane, indoline, azine, thiazine, xanthene, oxazine and acridine dyes.

3. The photohardenable composition of claim 2 wherein said cationic dye us selected from the group consisting of cationic cyanine, carbocyanine, hemicyanine, rhodamine, and azomethine dyes.

4. The photohardenable composition of claim 3 wherein said compound is an ethylenically unsaturated compound.

5. The photohardenable composition of claim 4 wherein at least one of $R^1$, $R^2$, $R^3$ and $R^4$ is an alkyl group.

6. The photohardenable composition of claim 1 where Z+ includes a alkyl chain containing 6 to 20 carbon atoms.

7. The photohardenable composition of claim 6 wherein Z+ is selected from the group consisting of trimethylcetylammonium, benzethonium, and cetylpyridinium.

8. The photohardenable composition of claim 7 wherein $R^1$, $R^2$, $R^3$ and $R^4$ have the same definition as $R^5$, $R^6$, $R^7$ and $R^8$.

9. The photohardenable composition of claim 8 wherein said composition exhibits improved reversal as compared to an identical composition not containing said borate salt.

10. The photohardenable composition of claim 7 wherein said borate salt is cetylpyridinium butyltriphenylborate.

11. The photohardenable composition of claim 1 wherein said cationic dye-borate anion complex is present in an amount of about 0.2 to 0.5% by weight.

12. The photohardenable composition of claim 1 wherein said borate salt is present in an amount of at least 0.2%.

13. The photohardenable composition of claim 12 wherein said borate salt is present in an amount of about 0.2 to 3%.

* * * * *

UNITED STATES PATENT AND TRADEMARK OFFICE
CERTIFICATE OF CORRECTION

PATENT NO. : 5,176,984

DATED : January 5, 1993

INVENTOR(S) : Jesse Hipps, Sr., et. al.

It is certified that error appears in the above-identified patent and that said Letters Patent is hereby corrected as shown below:

Column 5, line 49
  Claim 1:  After the D in the diagram, delete the "-" and insert a "+".

Claim 3:  Column 6, Line 23 - "us" should be --is--

Claim 6:  Column 6, Line 33 - "a" should be --an--

Signed and Sealed this

Twenty-eighth Day of December, 1993

Attest:

BRUCE LEHMAN

Attesting Officer    Commissioner of Patents and Trademarks